(12) United States Patent
Oh et al.

(10) Patent No.: US 12,393,122 B2
(45) Date of Patent: Aug. 19, 2025

(54) THINNER COMPOSITION AND METHOD OF PROCESSING SURFACES OF SEMICONDUCTOR SUBSTRATES

(71) Applicants: SK hynix Inc., Icheon-si (KR); TOKYO OHKA KOGYO CO., LTD., Kanagawa (JP)

(72) Inventors: Kyung Hee Oh, Icheon-si (KR); Jun Kyoung Lee, Icheon-si (KR); Tomoya Kumagai, Kanagawa (JP); Motoki Takahashi, Kanagawa (JP)

(73) Assignees: SK hynix Inc., Icheon-si (KR); TOKYO OHKA KOGYO CO., LTD., Kanagawa (JP)

( * ) Notice: Subject to any disclaimer, the term of this patent is extended or adjusted under 35 U.S.C. 154(b) by 682 days.

(21) Appl. No.: 17/549,939

(22) Filed: Dec. 14, 2021

(65) Prior Publication Data
US 2022/0243149 A1    Aug. 4, 2022

(30) Foreign Application Priority Data

Jan. 29, 2021 (KR) .......... 10-2021-0012724

(51) Int. Cl.
| | | |
|---|---|---|
| C11D 7/26 | (2006.01) | |
| C11D 3/20 | (2006.01) | |
| C11D 7/50 | (2006.01) | |
| G03F 1/68 | (2012.01) | |
| G03F 7/00 | (2006.01) | |
| G03F 7/42 | (2006.01) | |

(52) U.S. Cl.
CPC ........ G03F 7/70033 (2013.01); C11D 3/2068 (2013.01); C11D 3/2096 (2013.01); C11D 7/263 (2013.01); C11D 7/266 (2013.01); C11D 7/267 (2013.01); G03F 1/68 (2013.01); G03F 7/422 (2013.01); C11D 2111/22 (2024.01)

(58) Field of Classification Search
CPC ..... C11D 3/2068; C11D 3/2096; C11D 7/263; C11D 7/266; C11D 7/267

USPC ................. 510/175, 176, 505, 506
See application file for complete search history.

(56) References Cited

U.S. PATENT DOCUMENTS

| | | | |
|---|---|---|---|
| 4,886,728 A | 12/1989 | Salamy et al. | |
| 9,952,510 B2 * | 4/2018 | Choi | G03F 7/168 |
| 2007/0097851 A1 * | 5/2007 | Adachi | H04L 5/026 |
| 2016/0005595 A1 * | 1/2016 | Liu | G03F 7/405 |
| | | | 438/763 |
| 2018/0195030 A1 * | 7/2018 | Sakanishi | G03F 7/425 |

FOREIGN PATENT DOCUMENTS

| | | | |
|---|---|---|---|
| CN | 106483769 A | 3/2017 | |
| EP | 0851300 A1 * | 7/1998 | C11D 1/00 |
| JP | H07-160008 A | 6/1995 | |
| KR | 10-2011-0127816 A | 11/2011 | |
| KR | 10-2013-0016881 A | 2/2013 | |
| KR | 10-2013-0016882 A | 2/2013 | |
| KR | 10-2018-0050979 A | 5/2018 | |
| KR | 10-2018-0082967 A | 7/2018 | |
| WO | WO-2021204651 A1 * | 10/2021 | C11D 17/0008 |

OTHER PUBLICATIONS

Office Action dated Jun. 11, 2025 from Chinese Patent Office issued for the corresponding Chinese patent application No. 202210105865.9.

* cited by examiner

*Primary Examiner* — Gregory R Delcotto

(57) ABSTRACT

The present disclosure relates to a thinner composition for removing a resist and a processing method of a semiconductor substrate using the thinner composition. Particularly, the thinner composition includes (a) propylene glycol monoalkyl ether, (b) propylene glycol monoalkyl ether acetate, (c) cyclohexanone, and (d) cyclopentanone. In addition, the processing method of a semiconductor substrate includes applying a resist composition on a semiconductor substrate and removing the applied resist composition using the thinner composition of the present invention.

10 Claims, 2 Drawing Sheets

THINNER COMPOSITION AND METHOD OF PROCESSING SURFACES OF SEMICONDUCTOR SUBSTRATES

CROSS-REFERENCE TO RELATED APPLICATION

The present application claims priority under 35 U.S.C. § 119(a) to Korean patent application number 10-2021-0012724, filed on Jan. 29, 2021, in the Korean Intellectual Property Office, the entire disclosure of which is incorporated herein by reference.

TECHNICAL FIELD

The present disclosure relates to a thinner composition that improves edge bead removal (EBR) effects and a method of processing a surface of a semiconductor substrate using the thinner composition.

BACKGROUND

Minute circuit patterns such as semiconductor integrated circuits are formed applying a photoresist, including a photoresist compound and a solvent, onto a conductive metal layer or an oxide layer. The photoresist is formed on a substrate by a spin or rotational coating method, and then subsequent exposing, developing, etching and delaminating processes are performed.

After applying the photoresist, a subsequent exposing process uses light having a short wavelength (e.g., ultraviolet light) to expose desired minute patterns on a coated layer. The exposing process is highly sensitive to internal and external contamination. Excess photoresist residue and other contaminants that remain in the edge portion or rear portion of a substrate may become fatal contaminants in the exposing process. Accordingly, it has been suggested that an EBR process or a back rinse process can be performed prior to the exposing process to remove undesired photoresist residue and contaminants at the edge portion or rear portion of the substrate.

An EBR process or a back rinse process can be performed using a thinner composition for removing a photoresist.

In the related art, examples of compositions used in the process of removing a photoresist include a single solvent such as ethylcellosolve acetate (ECA), methylmethoxy propionate (MMP) and ethyl lactate (EL). Such compositions can be useful in removing a photoresist used in KrF and ArF (including ArF immersion) lithography.

Recently, demand for improvement in the integration degree of semiconductor devices calls for the use of a photoresist that can be used in extreme ultraviolet lithography (EUV). EUV is useful for the formation of minute patterns in semiconductor devices having a high degree of integration. However, when a thinner composition of a single solvent used in removing a photoresist for KrF and ArF is used for EUV, residual photoresist may remain or an EBR cross-section with poor characteristics results. Accordingly, the development of a thinner composition for use with EUV is needed to prevent or reduce the occurrence of defects in the formation of minute patterns so that next-generation semiconductor devices can be satisfactorily achieved.

In order to improve the stability of EBR processes, the development of a thinner composition that may easily remove a photoresist for EUV as well as a photoresist for KrF and ArF is demanded.

SUMMARY

An aspect of the present disclosure is directed to providing a thinner composition that can be used to improve EBR effects.

In another aspect of the present disclosure, a method of processing the surface of a semiconductor substrate using the thinner composition is provided.

Various embodiments of the present disclosure are directed to thinner compositions for removing a resist including (a) propylene glycol monoalkyl ether, (b) propylene glycol monoalkyl ether acetate, (c) cyclohexanone, and (d) cyclopentanone.

Various other embodiments of the present disclosure are directed to methods of processing the surface of a semiconductor substrate by applying a photoresist on a semiconductor substrate and performing an EBR process for removing the photoresist formed on edge and/or rear surfaces of the substrate by spraying a thinner composition comprising propylene glycol monoalkyl ether, propylene glycol monoalkyl ether acetate, cyclohexanone, and cyclopentanone.

By providing thinner compositions that have at least four-components and that have specific compositions according to concepts in this disclosure, unnecessary or excess resist that attaches to an edge portion or a rear portion of a substrate during manufacturing a semiconductor device and a thin film transistor may be efficiently and quickly removed, and EBR cross-section profiles may be improved. In addition, because the surface of the substrate is processed using the thinner composition prior to applying a photoresist, the photoresist may be uniformly coated on the entire surface of the substrate using a smaller or reduced amount. As a result, photoresist application rates may be markedly improved, the amount used of the photoresist may be saved, and at the same time, the efficiency and productivity of manufacturing processes may be achieved. For example, semiconductor manufacturing processes that generate unwanted particles leading to defects can be improved to reduce the defect ratios, process efficiency may be increased, and the semiconductor manufacturing yield may be even further improved through the use of disclosed thinner compositions.

BRIEF DESCRIPTION OF THE DRAWINGS

The above and other features and beneficial aspects of the disclosed technology will become readily apparent with reference to the following detailed description when considered in conjunction with the accompanying drawings.

The accompanying drawings in the disclosure are included to illustrate embodiments of the present invention and to provide a further understanding of the inventive concepts together with the detailed description, and accordingly, the scope of the disclosed concepts should not be interpreted to be limited to the matters described in such drawings or detailed description.

DETAILED DESCRIPTION

Figure 1:
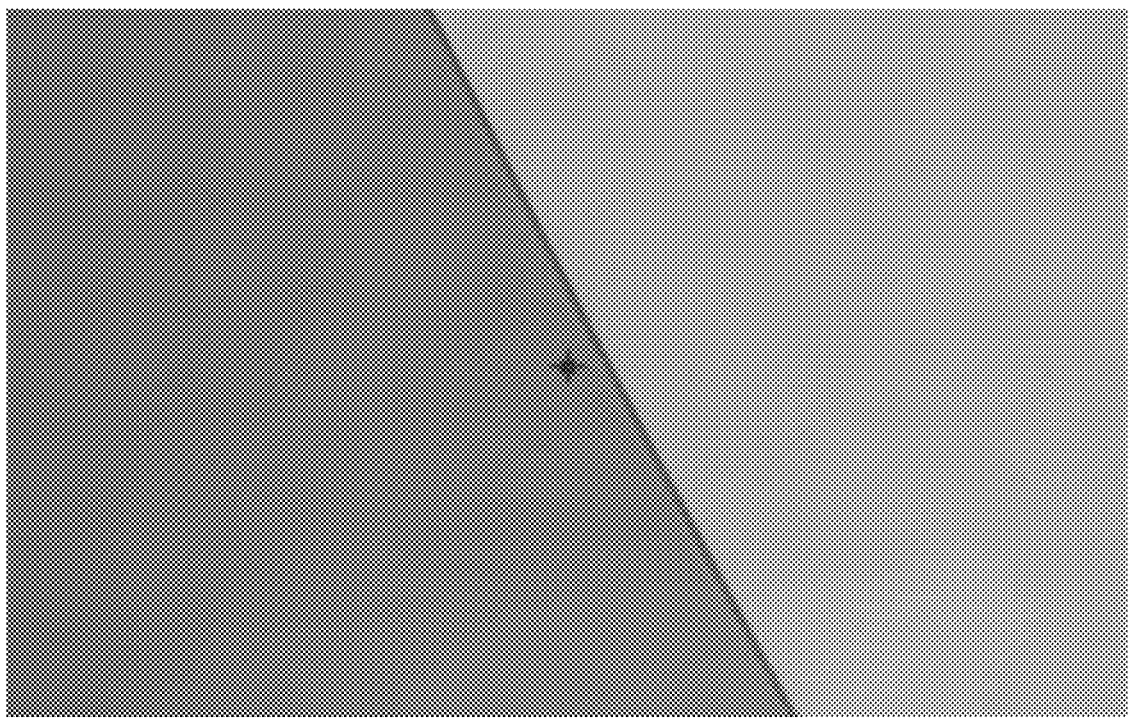
FIG. 1 is an electron microscope photograph of a resist layer after an EBR process using a thinner composition of Example 2.

A thinner composition for removing a resist according to an embodiment includes (a) propylene glycol monoalkyl ether, (b) propylene glycol monoalkyl ether acetate, (c) cyclohexanone and (d) cyclopentanone. A discussion of each component follows.

(a) Propylene Glycol Monoalkyl Ether

The (a) propylene glycol monoalkyl ether is a material having excellent dissolving power (i.e., solubility) with respect to various types of resists, such as for example a methacrylate-based photoresist used for ArF. If the (a) propylene glycol monoalkyl ether is used as a component of a thinner composition for removing a resist, the solubility of the resist may be improved. For example, because propylene glycol monoalkyl ether has high volatility, if the amount of propylene glycol monoalkyl ether increases in a composition, then the solubility of the resist may also increase. Excessive solubility, however, may result in deviations or inconsistencies in the thickness of the resist, or result in lifting.

In the propylene glycol monoalkyl ether, the term "alkyl" refers to a group that preferably has 1 to 10 carbon atoms. Particularly, the (a) propylene glycol monoalkyl ether may be at least one or more selected from the group consisting of propylene glycol monomethyl ether, propylene glycol monoethyl ether, propylene glycol monopropyl ether and propylene glycol monobutyl ether. Particularly, the propylene glycol monoalkyl ether may be propylene glycol monomethyl ether.

Based on the total weight of a thinner composition, the (a) propylene glycol monoalkyl ether may be included by weight percent (wt %). For example, the (a) propylene glycol monoalkyl ether may range from 1 wt % to 35 wt %; from 1 wt % to 30 wt %; or from 1 wt % to 25 wt % of the thinner composition.

If the amount of the (a) propylene glycol monoalkyl ether satisfies one of the aforementioned ranges, then the properties of edge bead regions and EBR cross-section profiles may be improved. If the amount of the (a) propylene glycol monoalkyl ether is less than 1 wt %, however, the dissolving power of the thinner composition with respect to the resist may be reduced. Consequently, any improvement to EBR cross-section profiles may be insignificant, and the removal of a photosensitive layer during performing a rework process may be more difficult due to the increased generation of defects. If the amount of the (a) propylene glycol monoalkyl ether is greater than 30 wt %, then the volatility of the thinner composition may increase, and a resist formed after pre-wetting may not be uniform and may show large thickness deviations.

(b) Propylene Glycol Monoalkyl Ether Acetate

The (b) propylene glycol monoalkyl ether acetate is a material having relatively low polarity as well as excellent dissolving power with respect to all photoresists. In addition, the (b) propylene glycol monoalkyl ether acetate in the composition contributes to surface tension characteristics that allow the uniform application of a photoresist to be achieved. Accordingly, EBR process properties and reducing resist consumption (RRC) process effects may be markedly improved.

In the propylene glycol monoalkyl ether acetate, the term "alkyl" refers to a group that preferably has 1 to 10 carbon atoms. Particularly, the (b) propylene glycol monoalkyl ether acetate may be at least one or more selected from the group consisting of propylene glycol monomethyl ether acetate, propylene glycol monoethyl ether acetate, propylene glycol monopropyl ether acetate and propylene glycol monobutyl ether acetate.

Based on the total weight of a thinner composition, the (b) propylene glycol monoalkyl ether acetate may be included by weight percent. For example, the (b) propylene glycol monoalkyl ether acetate may be included in a range from 40 wt % to 70 wt %, from 40 wt % to 60 wt %, or from 45 wt % to 55 wt % of the thinner composition for removing a resist.

If the amount of the (b) propylene glycol monoalkyl ether acetate satisfies any of the aforementioned ranges, suitable surface tension may be achieved to result in excellent uniformity of a photoresist coating that can be maintained, while a tailing phenomenon might not be generated in an EBR process at an edge portion so that a removing process may be effectively performed.

If the amount of the (b) propylene glycol monoalkyl ether acetate is less than 40 wt %, then humps at an edge portion may be intensified, or residues may be formed at an edge portion. If the amount of the (b) propylene glycol monoalkyl ether acetate is greater than 70 wt %, then surface tension may increase. As a result, when a photoresist is applied, it may not be uniformly spread out so that a minute pattern step (an ununiform thickness) on a wafer may not be overcome, and accordingly, a splitting phenomenon at an edge portion may arise.

(c) Cyclohexanone and (d) Cyclopentanone

The (c) cyclohexanone and the (d) cyclopentanone are both materials having excellent dissolving power with respect to all photoresists. The (c) cyclohexanone and the (d) cyclopentanone are used as components of a composition for removing a resist and are used to accommodate the increase of resist solubility so that suitable surface tension is achieved along with excellent EBR properties.

Based on the total weight of a thinner composition, the (c) cyclohexanone and the (d) cyclopentanone may be included by weight percent. For example, the (c) cyclohexanone and the (d) cyclopentanone may together be included in a range from 25 wt % to 59 wt %, from 25 wt % to 50 wt %, or from 25 wt % to 45 wt % of the thinner composition. In addition, the content of the (c) cyclohexanone in a thinner composition is preferably from 40 wt % to 60 wt %, or from 45 wt % to 55 wt % with respect to the total with the (d) cyclopentanone. The content of the (d) cyclopentanone in a thinner composition is preferably from 60 wt % to 40 wt %, or from 55 wt % to 45 wt % with respect to the total with the (c) cyclohexanone.

When the total amount of the (c) cyclohexanone and the (d) cyclopentanone is included in the aforementioned ranges, it is possible to prepare a thinner composition having improved solubility in a photoresist and reduced surface tension. Using such a thinner composition, it is possible to perform a stable EBR process even when the process conditions are changed. In contrast, if the total amount of the (c) cyclohexanone and the (d) cyclopentanone deviates from the range, then defects may be generated due to tailing during an EBR process, and discoloration and other defects may arise due to uneven film thickness during photoresist application.

According to some embodiments, the weight ratio of the (c) cyclohexanone to the (d) cyclopentanone may be within a range of weight ratios from 1:0.1 to 1:10, such as for example, within a range of weight ratios of 1:0.2 to 1:8, preferably within a range of weight ratios of 1:0.8 to 1:1.2. In other embodiments, the ratio of the (c) cyclohexanone to the (d) cyclopentanone may exceed such ranges and may be, for example, 3:1.

If the weight ratio of the (c) cyclohexanone and the (d) cyclopentanone satisfies the aforementioned ranges, then excellent dissolving power with respect to a photoresist and appropriate surface tension may be secured.

If the weight ratio of the (c) cyclohexanone with respect to the (d) cyclopentanone deviates from the aforementioned ranges, residues at an edge may increase.

The beneficial effects of the thinner composition may be further improved with common additives such as a surfactant. A surfactant may be fluorine-based, nonionic or ionic, but the surfactant is not limited to these examples. The additives may be included in about 10 to 500 ppm by weight with respect to the thinner composition to improve EBR results.

As described above, embodiments of the disclosure include thinner compositions that are nontoxic to humans, that do not show odor-induced discomfort and that have high work stability and low corrosiveness. In addition, unnecessary photoresist at the edge portion or rear portion of a substrate, which may result from increases in the diameter of the substrate used for the manufacture of a semiconductor device, may be uniformly and effectively removed in a short period of time. In addition, because the thinner compositions have excellent dissolving power with respect to various photoresists and a bottom anti-reflective coating (BARC), EBR properties, rework properties and the process of applying of a photoresist may be improved. Accordingly, the thinner compositions may be used in a pre-treatment process of a wafer surface prior to applying a photoresist in an EBR process, a rework process, a washing process of the bottom of a wafer, etc.

With the increase of the caliber of a substrate (wafer) used during the manufacturing of an integrated circuit, RRC processes for reducing the amount of a photoresist used have been researched and developed for cost reduction. In an RRC process, a small amount of a photoresist may be used to uniformly coated on the entire surface of a substrate by treating the surface of a substrate with a pre-treating composition prior to applying a photoresist. If a thinner composition of the disclosure is used in such an RRC process, the amount of unwanted particles that may be generated during the manufacturing process of a semiconductor may be minimized, a defect ratio may be markedly reduced, and RRC process efficiency may be improved.

The thinner composition of the present disclosure may preferably be applied to a photoresist resin using a high energy light or energy source, such as light with a wavelength of 500 nanometers (nm) or less, X-ray, electron beam, and so on. Particularly, the thinner composition of the present disclosure may preferably be applied to photoresists for EUV, i-line, KrF, or ArF.

Generally, photoresists for i-line, KrF, ArF or EUV each include photoresist resin having different basic structure. Therefore, the composition of a thinner composition of the disclosure may be adjusted according to the type of photoresist used in order to improve solubility and coatability. However, thinner compositions of the present disclosure have excellent dissolving power with respect to most photoresists and may satisfy the dissolving power requirements for photoresists with high polarity and for the main components of an antireflective layer. Accordingly, by using thinner compositions of the present disclosure, contamination of production equipment (e.g., contamination of the cup holder of a coater or the blocking of an outlet) is prevented even after finishing an EBR process using a photoresist for KrF or ArF in addition to a photoresist for EUV, a washing process performed on the bottom of a wafer and a pre-treatment process performed on the top of the wafer before applying the photoresist, productivity can be improved.

Method of Processing Surface of Semiconductor Substrate

In another aspect of the disclosure, methods of processing a surface of a semiconductor substrate using thinner compositions of the present disclosure are provided.

In an embodiment, a method may include spraying a thinner composition onto an edge portion and a rear portion of a substrate, on which a photoresist composition is coated, to remove any unnecessary portion of the photoresist layer during a manufacturing process of a semiconductor device or a thin film transistor.

In an embodiment, the method may include a step of applying a photoresist to a substrate and a step of performing an EBR process for removing photoresist formed at an edge and/or a rear surface of the substrate, including spraying a thinner composition of the present disclosure.

The photoresist may be a photoresist for KrF or ArF, or a photoresist for EUV.

During the EBR process, the thinner composition may be sprayed onto the edges and rear surfaces of the substrate at a rate of 5 to 50 cc/min while the substrate rotates. Contamination of the substrate by unnecessary photoresist may be effectively prevented through disclosed EBR methods.

In addition to the processing of surfaces of semiconductor substrates, in additional embodiments of the disclosure, subsequent processes well known in the technical field of manufacturing semiconductor devices and thin film transistors may be additionally performed after performing the EBR process.

For example, after removing humidity or moisture from a photoresist layer by performing a soft baking process in a temperature range of about 100° C. to 150° C., or in a range of about 100° C. to 120° C., an exposing step for selectively exposing a partial region of the photoresist layer using an exposing mask may be performed.

Then, the photoresist layer may be developed using a developing solution such as tetramethyl ammonium hydroxide (TMAH) and n-butyl acetate (n-BA) to complete a photoresist pattern. In an example, if a positive photoresist is used, then an exposed photoresist layer portion may be removed, and if a negative photoresist is used, then an exposed photoresist layer may remain.

A photoresist pattern completed through the aforementioned processes may be used for forming various minute patterns of a semiconductor device. However, if there are defects in the completed photoresist pattern, then it is advantageous from an economic point of view to remove the defective photoresist pattern and to reuse the substrate.

That is, if there are defects in the photoresist pattern formed on the substrate, a step of performing a rework process for removing the photoresist pattern using a thinner composition of the present disclosure may be further included. Then, after removing the photoresist pattern using the thinner composition, a process of drying the thinner composition remaining on the substrate may be performed. Accordingly, after the removal of the photoresist using the disclosed methods, the substrate may be reused.

In further embodiments, methods of processing a surface of a semiconductor substrate may also include a step of applying a hard mask layer or an anti-reflective layer on a substrate; a step of spraying a thinner composition; and a step of applying a photoresist.

The step of spraying the thinner composition may be performed through a common method such as spin coating. Examples include a method of applying a thinner composition on a substrate and then rotating the substrate to coat the rear and/or front surfaces of the substrate with the thinner composition, and a method of applying the thinner composition onto a rotating substrate by spraying and then coating the rear and/or front surfaces of the substrate with the thinner composition.

If the thinner composition is sprayed prior to applying the photoresist using methods described above, a removing process may be effectively performed without generating a tailing phenomenon during the subsequent removing process (EBR) of unnecessary photoresist at the edge portion of a substrate, and coating uniformity may be maintained excellent. In addition, by spraying the thinner composition prior to applying the photoresist, wettability of the substrate may be improved before applying the photoresist, and a photoresist layer with a thin and uniform thickness may be formed using a small amount of the photoresist. Furthermore, the coating defects of a photoresist layer at the edge portion of the substrate may be minimized, an ununiform thickness that may be present on the substrate may be easily overcome, and the deviations in thickness of the photoresist layer may be reduced.

Specific structural or functional descriptions of examples of embodiments in accordance with concepts that are disclosed in this specification are illustrated only to describe the examples of embodiments in accordance with the concepts. Examples of embodiments in accordance with the concepts may be carried out in various forms, however, and the descriptions are not limited to the examples of embodiments described below.

Various modifications and changes may be applied to the examples of embodiments in accordance with the concepts so that the examples of embodiments will be illustrated in the drawings and described in the specification. However, the embodiments according to the concept of the present disclosure are not construed as limited to specified disclosures, and include all changes, equivalents, or substitutes that do not depart from the spirit and technical scope of the present disclosure. In describing those embodiments, description will be omitted for techniques that are well known to the art to which the present disclosure pertains, and are not directly related to the present disclosure. This intends to disclose the gist of the present disclosure more clearly by omitting unnecessary description.

EXAMPLES

Example 1

To a vessel, individual compounds were injected so that the composition was as follows: 15 wt % of propylene glycol monomethyl ether, 55 wt % of propylene glycol monomethyl ether acetate, 15 wt % of cyclohexanone and 15 wt % of cyclopentanone to prepare a thinner composition for removing a resist (see Table 1 below).

Example 2

To a vessel, individual compounds were injected so that the composition was as follows: 5 wt % of propylene glycol monomethyl ether, 55 wt % of propylene glycol monomethyl ether acetate, 20 wt % of cyclohexanone and 20 wt % of cyclopentanone to prepare a thinner composition for removing a resist (see Table 1 below).

Example 3

To a vessel, individual compounds were injected so that the composition was as follows: 5 wt % of propylene glycol monomethyl ether, 45 wt % of propylene glycol monomethyl ether acetate, 25 wt % of cyclohexanone and 25 wt % of cyclopentanone to prepare a thinner composition for removing a resist (see Table 1 below).

Example 4

To a vessel, individual compounds were injected so that the composition was as follows: 37 wt % of propylene glycol monomethyl ether, 55 wt % of propylene glycol monomethyl ether acetate, 4 wt % of cyclohexanone and 4 wt % of cyclopentanone to prepare a thinner composition for removing a resist (see Table 1 below).

Example 5

To a vessel, individual compounds were injected so that the composition was as follows: 9 wt % of propylene glycol monomethyl ether, 75 wt % of propylene glycol monomethyl ether acetate, 8 wt % of cyclohexanone and 8 wt % of cyclopentanone to prepare a thinner composition for removing a resist (see Table 1 below).

Example 6

To a vessel, individual compounds were injected so that the composition was as follows: 1 wt % of propylene glycol monomethyl ether, 39 wt % of propylene glycol monomethyl ether acetate, 30 wt % of cyclohexanone and 30 wt % of cyclopentanone to prepare a thinner composition for removing a resist (see Table 1 below).

Example 7

To a vessel, individual compounds were injected so that the composition was as follows: 10 wt % of propylene glycol monomethyl ether, 70 wt % of propylene glycol monomethyl ether acetate, 10 wt % of cyclohexanone and 10 wt % of cyclopentanone to prepare a thinner composition for removing a resist (see Table 1 below).

Example 8

To a vessel, individual compounds were injected so that the composition was as follows: 5 wt % of propylene glycol monomethyl ether, 55 wt % of propylene glycol monomethyl ether acetate, 2 wt % of cyclohexanone and 38 wt % of cyclopentanone to prepare a thinner composition for removing a resist (see Table 1 below).

Example 9

To a vessel, individual compounds were injected so that the composition was as follows: 15 wt % of propylene glycol monomethyl ether, 65 wt % of propylene glycol monomethyl ether acetate, 15 wt % of cyclohexanone and 5 wt % of cyclopentanone to prepare a thinner composition for removing a resist (see Table 1 below).

Comparative Example 1

To a vessel, individual compounds were injected so that the composition was as follows: 15 wt % of propylene glycol monomethyl ether, 55 wt % of propylene glycol monomethyl ether acetate, and 30 wt % of cyclohexanone to prepare a thinner composition for removing a resist (see Table 1 below).

Comparative Example 2

To a vessel, individual compounds were injected so that the composition was as follows: 5 wt % of propylene glycol monomethyl ether, 55 wt % of propylene glycol monomethyl ether acetate, and 40 wt % of cyclohexanone to prepare a thinner composition for removing a resist (see Table 1 below).

Comparative Example 3

To a vessel, individual compounds were injected so that the composition was as follows: 25 wt % of propylene glycol monomethyl ether, 55 wt % of propylene glycol monomethyl ether acetate, and 20 wt % of cyclohexanone to prepare a thinner composition for removing a resist (see Table 1 below).

Comparative Example 4

To a vessel, individual compounds were injected so that the composition was as follows: 15 wt % of propylene glycol monomethyl ether, 55 wt % of propylene glycol monomethyl ether acetate, and 30 wt % of cyclopentanone to prepare a thinner composition for removing a resist (see Table 1 below).

Comparative Example 5

To a vessel, individual compounds were injected so that the composition was as follows: 5 wt % of propylene glycol monomethyl ether, 55 wt % of propylene glycol monomethyl ether acetate, and 40 wt % of cyclopentanone to prepare a thinner composition for removing a resist (see Table 1 below).

Comparative Example 6

To a vessel, individual compounds were injected so that the composition was as follows: 25 wt % of propylene glycol monomethyl ether, 55 wt % of propylene glycol monomethyl ether acetate, and 20 wt % of cyclohexanone to prepare a thinner composition for removing a resist (see Table 1 below).

Experimental Example 1: Evaluation of EBR Performance

On a silicon wafer having a diameter of 300 nm, a resist for EUV (manufacturer: TOKYO OHKA KOGYO Co., Ltd. (TOK), product name: TOEL-0140) was applied to a layer thickness of 40 nm.

Then, while rotating the silicon wafer coated with the resist, about 7 ml of a thinner composition of Example 1 was discharged onto the edge of the wafer, and an EBR process was performed (discharge rate: 20 ml/min, discharge time 20 seconds). Additional silicon wafers were used in the same method with thinner compositions of Examples 2 to 9 and Comparative Examples 1 to 6, respectively.

Figure 2:
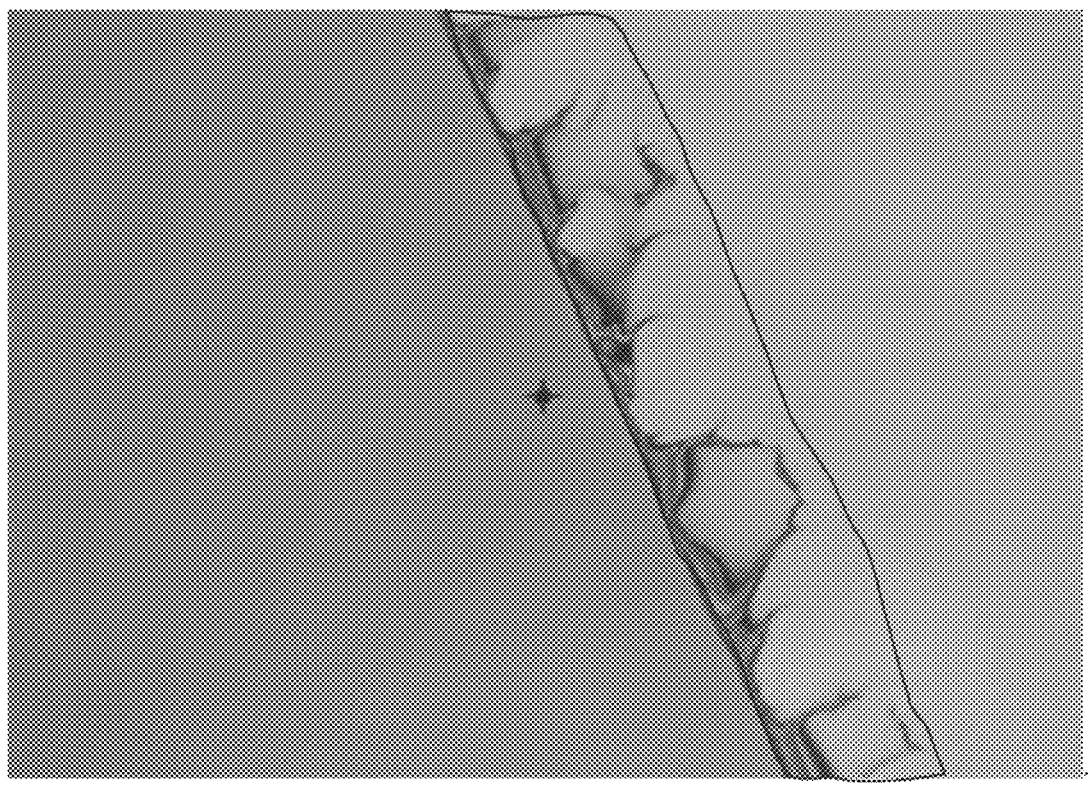
FIG. 2 is an electron microscope photograph of a resist layer after an EBR process using a thinner composition of Comparative Example 3.

Next, the wafer was dried by performing soft baking (110° C.), and by using an electron microscope (magnification 750×), evaluation of any humps, edge residues, and cut position shifts of the resist layer of the silicon wafer was conducted, with the results shown in Table 2 below. Electron microscope photographs of the resist layers of silicon wafers, to which the thinner composition of Example 2 and the thinner composition of Comparative Example 3 were applied, are shown in FIG. 1 and FIG. 2, respectively.

Evaluation Standards for Humps and Residue at an Edge (Hump/Edge Residue):

A: a case where EBR line uniformity on resist after EBR is constant.

B: a case where EBR line uniformity on resist after EBR is uniform by 75% or more.

C: a case where EBR line uniformity on resist after EBR is not uniform.

D: a case where the shape at an edge portion of a resist after EBR is distorted by the dissolution action of a thinner composition, or a tailing phenomenon is generated at an edge portion due to resist dissolution defects.

Evaluation Standards for Cut Position Shift:

○: a case where the EBR line width of a resist cross-section is less than 2.0 mm (±0.3 mm).

X: a case where the EBR line width of a resist cross-section is 2.0 mm (±0.3 mm) or more.

TABLE 1

|  | (a) propylene glycol monomethyl ether (wt %) | (b) propylene glycol monomethyl ether acetate (wt %) | (c) cyclohexanone (wt %) | (d) cyclopentanone (wt %) |
| --- | --- | --- | --- | --- |
| Example 1 | 15 | 55 | 15 | 15 |
| Example 2 | 5 | 55 | 20 | 20 |
| Example 3 | 5 | 45 | 25 | 25 |
| Example 4 | 37 | 55 | 4 | 4 |
| Example 5 | 9 | 75 | 8 | 8 |
| Example 6 | 1 | 39 | 30 | 30 |
| Example 7 | 10 | 70 | 10 | 10 |
| Example 8 | 5 | 55 | 2 | 38 |
| Example 9 | 15 | 65 | 15 | 5 |
| Comparative Example 1 | 15 | 55 | 30 | x |
| Comparative Example 2 | 5 | 55 | 40 | x |
| Comparative Example 3 | 25 | 55 | 20 | x |
| Comparative Example 4 | 15 | 55 | x | 30 |
| Comparative Example 5 | 5 | 55 | x | 40 |
| Comparative Example 6 | 25 | 55 | x | 20 |

TABLE 2

|  | Hump/Edge Residue | Cut position |
| --- | --- | --- |
| Example 1 | A | ○ |
| Example 2 | A | ○ |
| Example 3 | A | ○ |
| Example 4 | B | ○ |
| Example 5 | B | ○ |
| Example 6 | B | ○ |
| Example 7 | B | ○ |
| Example 8 | B | ○ |
| Example 9 | B | ○ |
| Comparative Example 1 | C | ○ |
| Comparative Example 2 | C | ○ |
| Comparative Example 3 | D | ○ |
| Comparative Example 4 | C | ○ |
| Comparative Example 5 | C | ○ |
| Comparative Example 6 | D | ○ |

Referring to Table 2, the thinner compositions of Examples 1 to 3 showed better EBR performance on the resist than the thinner compositions of Comparative Examples 1 to 6. In comparison, the performance of the thinner compositions of Comparative Examples 1 to 6 in resist removal was markedly degraded.

Referring to FIG. 1, where the thinner composition of Example 2 was used, the EBR line uniformity on the resist after EBR was regular and constant. On the contrary, referring to FIG. 2, where the thinner composition of Comparative Example 3 was used, the EBR line uniformity on the resist after EBR was not uniform, and a tailing phenomenon (refer to the inside of the line in FIG. 2) was generated on the layer around an edge portion due to dissolution defects.

With regard to the thinner compositions of Examples 4 to 9, varying the amount of components, from among the four component materials of the thinner composition in Table 1, reduced the performance of resist removal when compared with the thinner compositions of Examples 1 to 3. The inclusion of both cyclohexanone and cyclopentanone in Examples 4 to 9 compared to Comparative Examples 1 to 6 may have improved resist removal.

Experimental Example 2: EBR Evaluation (2)

On a silicon wafer having a diameter of 300 nm, a resist for ArF (manufacturer: TOK, product name: ATONH-8390) was applied to a layer thickness of 90 nm.

Then, while rotating the silicon wafer coated with the resist, about 7 ml of a thinner composition of Example 1 was discharged onto the edge portion of the wafer, and an EBR process was performed (discharge rate: 20 ml/min, discharge time 20 seconds). Additional silicon wafers were used in the same method with thinner compositions of Examples 2 to 3 and Comparative Examples 1 to 6, respectively.

After that, the wafer was dried by performing soft baking (110° C.), and by using an electron microscope (magnification 750×), evaluation of any humps, edge residues, and cut position shifts of the resist layer of the silicon wafer was conducted, and the results are shown in Table 3 below.

Evaluation Standards for Humps and Residue at Edge (Hump/Edge Residue):
  A: a case where EBR line uniformity on resist after EBR is constant.
  B: a case where EBR line uniformity on resist after EBR is uniform by 75% or more.
  C: a case where EBR line uniformity on resist after EBR is not uniform.
  D: a case where the shape at an edge portion of a resist after EBR is distorted by the dissolution action of a thinner composition, or a tailing phenomenon is generated at an edge portion due to resist dissolution defects.

Evaluation Standards for Cut Position Shift:
  ○: a case where the EBR line width of a resist cross-section is less than 2.0 mm (±0.3 mm).
  X: a case where the EBR line width of a resist cross-section is 2.0 mm (±0.3 mm) or more.

TABLE 3

|  | Hump/Edge Residue | Cut position |
| --- | --- | --- |
| Example 1 | A | ○ |
| Example 2 | A | ○ |
| Example 3 | A | ○ |
| Comparative Example 1 | C | ○ |
| Comparative Example 2 | C | ○ |
| Comparative Example 3 | D | ○ |
| Comparative Example 4 | C | ○ |
| Comparative Example 5 | C | ○ |
| Comparative Example 6 | D | ○ |

Referring to Table 3, the thinner compositions of Examples 1 to 3 showed better EBR performance on the resist for ArF than the thinner compositions of Comparative Examples 1 to 6. In comparison, the performance of the thinner compositions of Comparative Examples 1 to 6 in resist removal was degraded.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A thinner composition for removing a resist comprising propylene glycol monoalkyl ether, propylene glycol monoalkyl ether acetate, cyclohexanone, and cyclopentanone,
  wherein the propylene glycol monoalkyl ether comprises from 1 wt % to 35 wt %, based on a total weight, of the thinner composition;
  wherein the propylene glycol monoalkyl ether acetate comprises from 45 wt % to 55 wt %, based on the total weight, of the thinner composition;
  wherein a total amount of the combination of the cyclohexanone and the cyclopentanone comprises from 25 wt % to 45 wt %, based on the total weight, of the thinner composition; and
  wherein the ratio by weight of the cyclohexanone to the cyclopentanone is between 1:0.1 and 1:10.

2. The thinner composition for removing a resist according to claim 1, wherein the propylene glycol monoalkyl ether is at least one or more selected from the group consisting of propylene glycol monomethyl ether, propylene glycol monoethyl ether, propylene glycol monopropyl ether and propylene glycol monobutyl ether.

3. The thinner composition for removing a resist according to claim 1, wherein the propylene glycol monoalkyl ether acetate is at least one or more selected from the group consisting of propylene glycol monomethyl ether acetate, propylene glycol monoethyl ether acetate, propylene glycol monopropyl ether acetate and propylene glycol monobutyl ether acetate.

4. The thinner composition for removing a resist according to claim 1, wherein the propylene glycol monoalkyl ether comprises 15 wt %, the propylene glycol monoalkyl ether acetate comprises 55 wt %, the cyclohexanone comprises 15 wt %, and the cyclopentanone comprises 15 wt %, based on the total weight, of the thinner composition.

5. The thinner composition for removing a resist according to claim 1, wherein the propylene glycol monoalkyl ether comprises 5 wt %, the propylene glycol monoalkyl ether acetate comprises 55 wt %, the cyclohexanone comprises 20 wt %, and the cyclopentanone comprises 20 wt %, based on the total weight, of the thinner composition.

6. The thinner composition for removing a resist according to claim 1, wherein the propylene glycol monoalkyl ether comprises from 2 wt % to 30 wt %, based on the total weight, of the thinner composition.

7. A method of processing a surface of a semiconductor substrate, the method comprising:
applying a photoresist on a semiconductor substrate; and
performing an EBR process for removing the photoresist formed on edge and/or rear surfaces of the substrate by spraying a thinner composition according to claim 1 onto the substrate.

8. The method of processing a surface of a semiconductor substrate according to claim 7, wherein the photoresist is a photoresist for EUV, a photoresist for KrF or a photoresist for ArF.

9. The method of processing a surface of a semiconductor substrate of claim 7, wherein the propylene glycol monoalkyl ether comprises 15 wt %, the propylene glycol monoalkyl ether acetate comprises 55 wt %, the cyclohexanone comprises 15 wt %, and the cyclopentanone comprises 15 wt %, based on a total weight, of the thinner composition.

10. The method of processing a surface of a semiconductor substrate of claim 7, wherein the propylene glycol monoalkyl ether comprises 5 wt %, the propylene glycol monoalkyl ether acetate comprises 55 wt %, the cyclohexanone comprises 20 wt %, and the cyclopentanone comprises 20 wt %, based on a total weight, of the thinner composition.

* * * * *